(12) United States Patent
Thakur et al.

(10) Patent No.: US 7,989,864 B2
(45) Date of Patent: Aug. 2, 2011

(54) METHODS FOR ENHANCING CAPACITORS HAVING ROUGHENED FEATURES TO INCREASE CHARGE-STORAGE CAPACITY

(75) Inventors: Randhir P. S. Thakur, Cupertino, CA (US); Garry A. Mercaldi, Meridian, ID (US); Michael Nuttall, Meridian, ID (US); Shenline Chen, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/538,779

(22) Filed: Aug. 10, 2009

(65) Prior Publication Data
US 2009/0294819 A1 Dec. 3, 2009

Related U.S. Application Data

(60) Division of application No. 11/502,090, filed on Aug. 9, 2006, now Pat. No. 7,576,380, which is a continuation of application No. 10/781,987, filed on Feb. 18, 2004, now Pat. No. 7,101,756, which is a division of application No. 09/965,240, filed on Sep. 26, 2001, now Pat. No. 7,034,353, which is a continuation-in-part of application No. 09/692,897, filed on Oct. 19, 2000, now Pat. No. 6,682,970, which is a division of application No. 09/260,995, filed on Mar. 1, 1999, now Pat. No. 6,225,157, which is a division of application No. 09/032,182, filed on Feb. 27, 1998, now Pat. No. 6,150,706.

(51) Int. Cl.
*H01L 27/108* (2006.01)
*H01L 29/76* (2006.01)
*H01L 29/94* (2006.01)
*H01L 31/119* (2006.01)

(52) U.S. Cl. ......... 257/300; 257/303; 257/296; 257/306

(58) Field of Classification Search .................. 257/296, 257/288, 532, 300, 530, 310, 529, 311, 303, 257/306, 309, 308, 313
See application file for complete search history.

(56) References Cited

U.S. PATENT DOCUMENTS
4,211,941 A 7/1980 Schade, Jr. .................. 307/303
(Continued)

FOREIGN PATENT DOCUMENTS
EP 0 279 588 A2 8/1988

OTHER PUBLICATIONS

Kim, J. et al., "High Performance Antifuse with Planar Double Dielectrics on Si1-xGex Pad for Field Programmable Gate Array Applications", IEEE Electronic Letters, vol. 32, No. 24, pp. 2276-2277, Nov. 21, 1996.

(Continued)

*Primary Examiner* — Chuong A. Luu
(74) *Attorney, Agent, or Firm* — Dorsey & Whitney LLP

(57) ABSTRACT

Structures and methods for making a semiconductor structure are discussed. The semiconductor structure includes a rough surface having protrusions formed from an undoped silicon film. If the semiconductor structure is a capacitor, the protrusions help to increase the capacitance of the capacitor. The semiconductor structure also includes a relatively smooth surface abutting the rough surface, wherein the relatively smooth surface is formed from a polycrystalline material.

16 Claims, 11 Drawing Sheets

U.S. PATENT DOCUMENTS

| | | | | |
|---|---|---|---|---|
| 4,419,743 A | 12/1983 | Taguchi et al. | ............... | 365/149 |
| 4,551,906 A | 11/1985 | Ogura et al. | .................... | 29/571 |
| 4,748,490 A | 5/1988 | Hollingsworth | ................ | 357/51 |
| 4,782,032 A | 11/1988 | Geissberger et al. | ........... | 437/41 |
| 4,894,693 A | 1/1990 | Tigelaar et al. | ............... | 257/311 |
| 5,070,384 A | 12/1991 | McCollum et al. | .......... | 257/530 |
| 5,130,885 A * | 7/1992 | Fazan et al. | .................... | 361/313 |
| 5,227,323 A | 7/1993 | Nishitsuji et al. | ............... | 437/47 |
| 5,229,323 A | 7/1993 | Shimada et al. | ............. | 437/176 |
| 5,340,765 A | 8/1994 | Dennison et al. | ............... | 437/52 |
| 5,362,632 A | 11/1994 | Mathews | ........................ | 437/47 |
| 5,384,152 A | 1/1995 | Chu et al. | ........................ | 427/81 |
| 5,486,488 A | 1/1996 | Kamiyama | ..................... | 437/60 |
| 5,521,440 A | 5/1996 | Iranmanesh | ................. | 257/774 |
| 5,561,307 A | 10/1996 | Mihara et al. | ................. | 257/295 |
| 5,567,647 A | 10/1996 | Takahashi | ..................... | 437/177 |
| 5,587,613 A | 12/1996 | Iranmanesh | ................. | 257/613 |
| 5,597,754 A | 1/1997 | Lou et al. | ........................ | 437/52 |
| 5,608,249 A | 3/1997 | Gonzalez | ..................... | 257/306 |
| 5,622,893 A | 4/1997 | Summerfelt et al. | ......... | 438/396 |
| 5,627,395 A | 5/1997 | Witek et al. | ................... | 257/350 |
| 5,639,684 A | 6/1997 | Kwok | ............................ | 437/60 |
| 5,652,165 A | 7/1997 | Lu et al. | ......................... | 437/52 |
| 5,699,291 A | 12/1997 | Tsunemine | ................... | 365/149 |
| 5,728,616 A | 3/1998 | Sakao | ........................... | 438/240 |
| 5,770,500 A * | 6/1998 | Batra et al. | .................... | 438/255 |
| 5,786,259 A | 7/1998 | Kang | ............................ | 438/396 |
| 5,801,098 A * | 9/1998 | Fiordalice et al. | ........... | 438/653 |
| 5,804,479 A | 9/1998 | Aoki et al. | .................... | 438/253 |
| 5,814,852 A | 9/1998 | Sandhu et al. | ................. | 257/310 |
| 5,827,766 A | 10/1998 | Lou | ............................. | 438/253 |
| 5,837,593 A | 11/1998 | Park et al. | ..................... | 438/396 |
| 5,847,424 A | 12/1998 | Kang | ............................ | 257/306 |
| 5,854,734 A | 12/1998 | Sandhu et al. | ............. | 361/321.5 |
| 5,866,938 A | 2/1999 | Takagi et al. | ................. | 257/530 |
| 5,877,062 A | 3/1999 | Horii | ............................. | 438/396 |
| 5,877,978 A | 3/1999 | Morishita et al. | ............ | 365/149 |
| 5,903,023 A | 5/1999 | Hoshi | ........................... | 257/300 |
| 5,903,053 A | 5/1999 | Iijima et al. | ................... | 257/751 |
| 5,905,283 A | 5/1999 | Kasai | ............................ | 257/334 |
| 5,906,708 A | 5/1999 | Robinson et al. | .......... | 156/657.1 |
| 5,909,043 A | 6/1999 | Summerfelt | ................... | 257/298 |
| 5,930,106 A | 7/1999 | Deboer et al. | ................ | 361/305 |
| 5,969,983 A | 10/1999 | Thakur et al. | ................. | 365/149 |
| 5,970,309 A | 10/1999 | Ha et al. | ............................ | 438/3 |
| 5,976,928 A | 11/1999 | Kirlin et al. | .................... | 438/240 |
| 5,977,583 A | 11/1999 | Hosotani et al. | ............... | 257/311 |
| 5,994,183 A | 11/1999 | Huang et al. | ................... | 438/256 |
| 5,998,826 A | 12/1999 | Hung et al. | .................... | 257/315 |
| 6,010,931 A | 1/2000 | Sun et al. | ....................... | 438/240 |
| 6,010,940 A | 1/2000 | Lee et al. | ....................... | 438/396 |
| 6,015,743 A | 1/2000 | Zahurak et al. | ................ | 438/398 |
| 6,060,355 A | 5/2000 | Batra et al. | .................... | 438/255 |
| 6,060,743 A | 5/2000 | Sugiyama et al. | ............ | 257/321 |
| 6,096,630 A | 8/2000 | Byun et al. | .................... | 438/592 |
| 6,100,193 A | 8/2000 | Suehiro et al. | ................ | 438/685 |
| 6,114,200 A | 9/2000 | Yew et al. | ...................... | 438/253 |
| 6,130,482 A | 10/2000 | Iio et al. | ........................ | 257/774 |
| 6,140,173 A | 10/2000 | Wolters et al. | ................ | 438/240 |
| 6,150,208 A | 11/2000 | Deboer et al. | ................ | 438/240 |
| 6,150,705 A | 11/2000 | Chen | ............................ | 257/530 |
| 6,150,706 A | 11/2000 | Thakur et al. | ................. | 257/532 |
| 6,162,741 A | 12/2000 | Akasaka et al. | .............. | 438/773 |
| 6,171,925 B1 | 1/2001 | Graettinger et al. | .......... | 438/396 |
| 6,180,478 B1 | 1/2001 | Lee et al. | ....................... | 438/309 |
| 6,180,485 B1 | 1/2001 | Parekh et al. | ................. | 438/398 |
| 6,204,069 B1 | 3/2001 | Summerfelt et al. | ............. | 438/3 |
| 6,207,222 B1 | 3/2001 | Chen et al. | ........................ | 427/97 |
| 6,207,523 B1 | 3/2001 | Parekh et al. | ................. | 438/396 |
| 6,225,157 B1 | 5/2001 | Thakur et al. | ................. | 438/240 |
| 6,251,720 B1 | 6/2001 | Thakur et al. | ................. | 438/240 |
| 6,291,868 B1 | 9/2001 | Weimer et al. | ................ | 257/413 |
| 6,344,413 B1 | 2/2002 | Zurcher et al. | ................ | 438/678 |
| 6,392,284 B1 | 5/2002 | Thakur et al. | ................. | 257/530 |
| 6,458,645 B2 | 10/2002 | DeBoer et al. | ................ | 438/240 |
| 6,479,854 B1 | 11/2002 | Thakur et al. | ................. | 257/306 |
| 6,515,343 B1 | 2/2003 | Shroff et al. | ................. | 257/530 |
| 6,541,811 B2 | 4/2003 | Thakur et al. | ................. | 257/303 |
| 6,682,970 B1 | 1/2004 | Thakur et al. | ................. | 438/240 |
| 6,794,703 B1 | 9/2004 | Thakur et al. | ................. | 257/306 |
| 6,864,527 B2 | 3/2005 | DeBoer et al. | ................ | 257/303 |
| 2001/0041415 A1 | 11/2001 | Parekh et al. | ................. | 438/396 |
| 2002/0110975 A1 | 8/2002 | Parekh et al. | ................. | 438/239 |

OTHER PUBLICATIONS

P.M. Smith and J.S. Custer, "Chemical Vapor Deposition of Titanium-Silicon-Nitride-Films," *Applied Physics Letter*, 70(23):3116-3118, Jun. 1997.

* cited by examiner

TO ACCESS DEVICE
(FIG.3)

TO ACCESS DEVICE
(FIG.3)

METHODS FOR ENHANCING CAPACITORS HAVING ROUGHENED FEATURES TO INCREASE CHARGE-STORAGE CAPACITY

CROSS-REFERENCE TO RELATED APPLICATIONS

This application is a divisional of U.S. patent application Ser. No. 11/502,090, filed Aug. 9, 2006now U.S. Pat. No. 7,576,380, which is a continuation of U.S. patent application Ser. No. 10/781,987, filed Feb. 18, 2004, U.S. Pat. No. 7,101,756, which is a divisional of U.S. patent application Ser. No. 09/965,240, filed Sep. 26, 2001, U.S. Pat. No. 7,034,353, which is a continuation-in-part of U.S. patent application Ser. No. 09/692,897, filed Oct. 19, 2000, U.S. Pat. No. 6,682,970, which is a divisional of U.S. patent application Ser. No. 09/260,995, filed Mar. 1, 1999, U.S. Pat. No. 6,225,157, which is a divisional of U.S. patent application Ser. No. 09/032,182, filed Feb. 27, 1998, U.S. Pat. No. 6,150,706. Other related patents include U.S. Pat. No. 5,969,983, which is a divisional of U.S. Pat. No. 6,150,706; U.S. Pat. No. 6,479,854, which is a divisional of U.S. Pat. No. 6,150,706; U.S. Pat. No. 6,392,284, which is a divisional of U.S. Pat. No. 6,150,706; and U.S. Pat. No. 6,541,811, which is a continuation of U.S. Pat. No. 6,682,970. These applications and patents are incorporated by reference herein.

TECHNICAL FIELD

The invention relates generally to integrated circuits and more specifically to an integrated circuit capacitor having a barrier layer that forms at least a portion of at least one of the capacitor electrodes, and to an improved barrier layer.

BACKGROUND OF THE INVENTION

To increase storage density (the ratio of storage capacity to die size) and data-access speed, dynamic-random-access-memory (DRAM) manufacturers continue to reduce the geometries of and otherwise improve the structures and components that compose a DRAM circuit. One such component is the capacitor that is used as the storage element of a DRAM cell and one such structure is a diffusion barrier layer. Another such component is an antifuse, which often has a structure that is similar or identical to that of a capacitor.

Unfortunately, leakage and depletion often prevent DRAM manufacturers from shrinking the size of a DRAM-cell capacitor from its present size. Generally, leakage denotes the discharge current that flows through the capacitor dielectric when the capacitor is open-circuited, and thus is a measure of how fast the charge on a capacitor will leak away. In a capacitor with semiconductor electrodes, e.g., polysilicon, depletion denotes the affect of the depletion regions that form within these electrodes when the capacitor stores a charge. As the amount of leakage or depletion increases, the capacitor's storage capacity decreases. But unfortunately, the storage capacity of a DRAM capacitor can be reduced only so much before the DRAM cell can no longer hold its state between refresh cycles, and thus can no longer store data reliably. Therefore, because the storage capacity of a capacitor is proportional to the area of the capacitor plates, the area, and thus the overall size, of a DRAM capacitor often must be relatively large to compensate for the storage-capacity-robbing affects of leakage and depletion. That is, the DRAM capacitor often must be larger than it would have to be if leakage or depletion were reduced or eliminated.

Furthermore, conventional electrode material, such as polysilicon, often causes the access speed of a DRAM cell to be relatively slow. Often, the resistance of an electrode formed from such a material is relatively high. Therefore, because this resistance is effectively in series with the DRAM capacitor, it causes the time constant for charging/discharging the capacitor to be relatively large, and thus causes the DRAM cell to have a relatively long read/write time.

Additionally, conventional barrier materials often prevent manufacturers from reducing the dimensions of a structure disposed in a barrier layer. A barrier layer is often used to prevent the dopant in one layer from diffusing into an adjacent layer during circuit processing. A popular barrier material is tungsten silicide. But unfortunately, tungsten silicide crystallizes at about 800° C. and forms relatively large grains. This crystallization degrades tungsten silicide's barrier properties by orders of magnitude because dopants can easily diffuse along the grain boundaries. The large grains also prevent the use of tungsten silicide with relatively narrow structures such as wordlines. That is, if the structure's width is about the same as or is less than the grain size, tungsten silicide often cannot be used. Furthermore, although it can sometimes be used as such a barrier layer, titanium nitride oxidizes easily, and thus is unsuitable for use in many applications.

Moreover, conventional electrode materials may cause a circuit coupled to an antifuse to have a relatively slow access speed. An antifuse has a structure similar to that of a capacitor, but is typically used as a one-time programmable, nonvolatile storage element. For example, an antifuse can be "blown" into a short-circuited state by applying a programming voltage that is high enough to break down the dielectric such that the electrodes contact each other through the dielectric. Unfortunately, the relatively high resistance of conventional electrode materials may cause a blown antifuse to have a relatively high resistance. Because the circuit coupled to the antifuse often has a parasitic capacitance associated therewith, the relatively large time constant of the coupled antifuse electrodes and parasitic capacitance can cause the circuit to have a relatively slow access speed.

SUMMARY OF THE INVENTION

An illustrative aspect of the present invention includes a semiconductor structure with a rough surface having protrusions formed from an undoped silicon film. If the semiconductor structure is a capacitor, the protrusions help to increase the surface area of one of the electrodes of the capacitor, and hence, the capacitance of the capacitor. The semiconductor structure also includes a polycrystalline surface abutting the rough surface. The polycrystalline surface helps to enhance the structural integrity of the semiconductor structure should perforations exist in the rough surface.

DETAILED DESCRIPTION OF THE INVENTION

Figure 1:
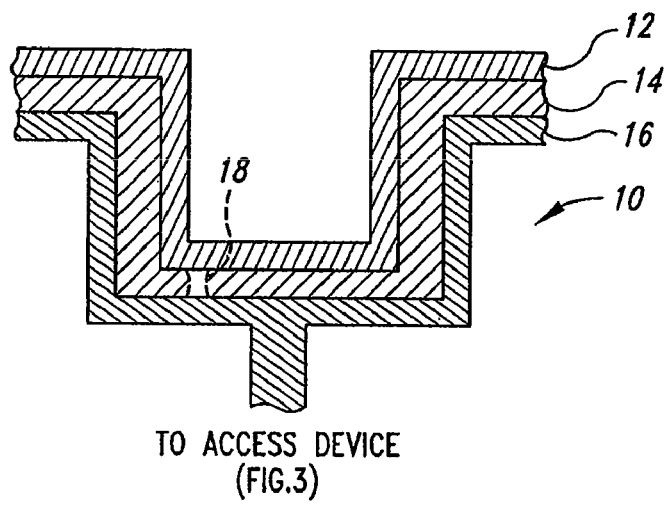
FIG. 1 is a cross-sectional view of a capacitor according to one embodiment of the invention.

FIG. 1 is a cross-sectional view of a DRAM capacitor 10 according to one embodiment of the invention. The capacitor 10 includes a conventional electrode 12, which is formed from a conductive material such as polysilicon. The electrode 12 is adjacent to one side of a conventional dielectric 14, which is formed from an insulator such as silicon dioxide, barium strontium titanate, or tantalum pentaoxide. Another electrode 16 is adjacent to another side of the dielectric 14, and is coupled to a DRAM-cell access device, such as a transistor. The electrode 16 is formed from a barrier material, and thus may be called a barrier electrode. The barrier electrode 16 may include conventional barrier materials, such as titanium nitride, or may include tungsten nitride, tungsten silicon nitride, or titanium silicon nitride, which are discussed below in conjunction with FIG. 3. Furthermore, although described for use in a DRAM cell, the capacitor 10 can be used for other applications and in other integrated circuits such as microprocessors.

The barrier electrode 16 allows the capacitor 10 to be significantly smaller than a conventional capacitor. For example, due to its relatively high work function, the barrier electrode 16 increases the height of the barrier to electron flow through the dielectric 14, and thus reduces the leakage of the capacitor 10. Furthermore, because the barrier electrode 16 is not a semiconductor material like polysilicon, there is no depletion in the electrode 16. Therefore, the overall depletion associated with the capacitor 10 is significantly reduced. Also, in one embodiment, the barrier electrode 16 is thinner than a conventional electrode such as the electrode 12. For example, a conventional polysilicon electrode such as the electrode 12 may be 600 Å thick, but the barrier layer 16 may be as thin as 10 to 100 Å. Additionally, the barrier electrode 16 has a significantly lower resistance than conventional electrodes such as the electrode 12, and thus reduces the series resistance of the capacitor 10. This also reduces the time constant associated with the capacitor 10, and thus increases the access speed of the DRAM cell that includes the capacitor 10. Moreover, the barrier electrode 16 also prevents dopants from diffusing from another layer into the dielectric 14, and prevents dopants in the dielectric 14 from diffusing out into other layers.

In another embodiment of the capacitor 10, the electrode 12 can be formed from silicon germanium, which has a lower work function than polysilicon. Thus, such an electrode 12 presents a higher barrier to the electron flow through the dielectric 14 than does polysilicon, and thus further reduces the leakage of the capacitor 10.

In still another embodiment, the electrodes 12 and 16 can be reversed. That is, the electrode 16 can be formed from a conventional electrode material such as polysilicon or from silicon germanium as discussed above, and the electrode 12 can be the barrier electrode. Alternatively, both the electrodes 12 and 16 can be barrier electrodes made from the same or different barrier materials. In such an embodiment, the leakage and thickness of the capacitor 10 are further reduced, and the depletion is virtually eliminated.

Furthermore, although shown having planar sides in FIG. 1 for clarity, in an embodiment where the electrode 12 is a barrier electrode, the electrode 16 may be formed with a rough or bumpy surface to increase its surface area. One conventional material that is suitable to form such a rough electrode 16 is hemispherical silicon grain (HSG) polysilicon. Also, the dielectric 14 and electrode 12 are formed such that they conform to the adjacent rough surface of the electrode 16, and thus also have increased surface areas. Therefore, the increased surface areas of the electrodes 12 and 13 and the dielectric 14 increase the capacitance of the capacitor 10.

In yet another embodiment, the capacitor 10 can be used as an antifuse. As previously discussed, an antifuse is a programmable, nonvolatile device that is normally electrically open but can be programmed to become electrically closed, i.e., a short circuit. For example, referring to the capacitor 10, to form one or more short circuits 18, a sufficient voltage is applied across the electrodes 12 and 16 so as to cause the dielectric 14 to break down and the short circuit 18 to develop between the electrodes 12 and 16. Because the electrode 16 is a barrier electrode, the series resistance of such an antifuse is significantly reduced as is the time constant associated with the antifuse. Therefore, circuitry coupled to the antifuse can operate at a higher speed than with a conventional, higher-resistance antifuse.

Figure 2:
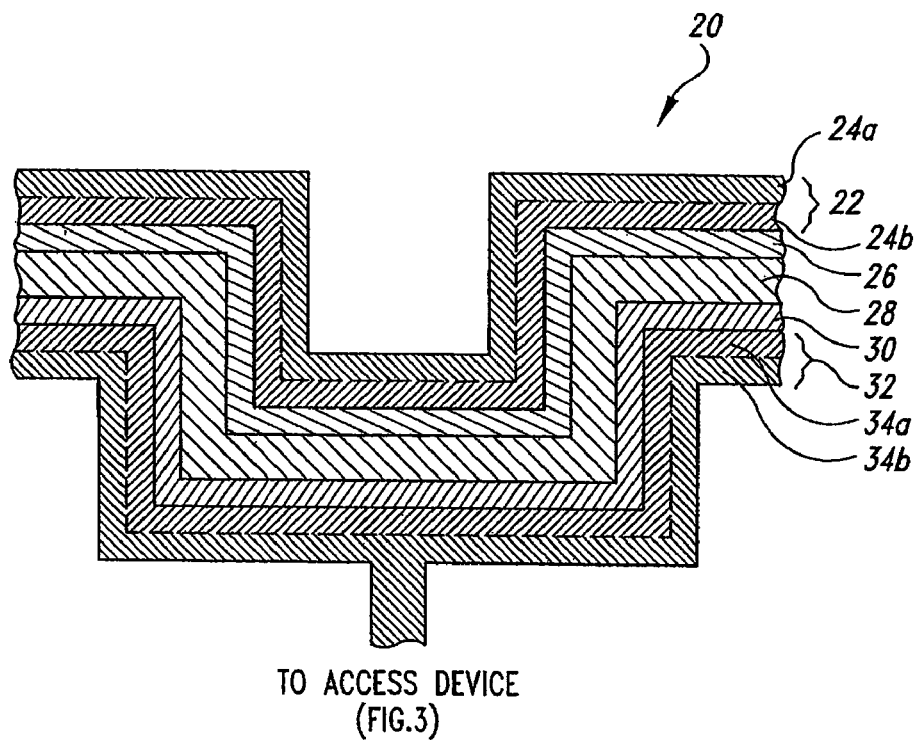
FIG. 2 is a cross-sectional view of a capacitor according to another embodiment of the invention.

FIG. 2 is a cross-sectional view of a DRAM capacitor 20 according to another embodiment of the invention. The capacitor 20 includes a first electrode 22, which may be one continuous layer or may include separate layers 24a and 24b. A first barrier layer 26 is disposed adjacent to one side of the electrode 22, a conventional dielectric 28 is disposed adjacent to an opposite side of the barrier layer 26, a second barrier layer 30 is disposed adjacent to another side of the dielectric 26, and a second electrode 32 is adjacent to an opposite side of the barrier layer 30. Like the first electrode 22, the second electrode 32 may be one continuous layer or may include separate layers 34a and 34b. Furthermore, like the barrier electrode 16 of FIG. 1, the barrier layers 26 and 30 may be formed from conventional barrier materials such as a titanium nitride, or may be formed from tungsten nitride, tungsten silicon nitride, or titanium silicon nitride. The barrier layers 26 and 30, however, can be formed such that they do not form a silicide with the adjacent electrodes 22 and 32, respectively. Alternatively, one or both of the layers 24b and 34a may be silicide layers, or respective silicide layers may be disposed between the layers 24b and 34a and the dielectric 28. Additionally, although described as used in a DRAM, the capacitor 20 may be used in other applications as well.

As discussed above in conjunction with the barrier electrode 16 of FIG. 1, the barrier layers 26 and 30 reduce the leakage, depletion, series resistance, and thickness of the capacitor 20 as compared with conventional capacitors, and thus allow the capacitor 20 to be significantly smaller than conventional capacitors. For example, by increasing the barrier to electron flow through both sides of the dielectric 28, the barrier layers 26 and 30 significantly reduce the leakage of the capacitor 20. Furthermore, where one or both of the electrodes 22 and 32 are formed from polysilicon or another semiconductor material, the respective barrier layers 26 and 30 (having respective thicknesses as low as 10 to 100 Å in one embodiment) allow the respective thicknesses of the electrodes 22 and 32 to be reduced from approximately 600 Å (the typical thickness of a conventional semiconductor electrode as discussed above in conjunction with FIG. 1) to approximately 200 Å. Thus, not only does this reduction in thickness reduce the overall thickness of the capacitor 20, it also significantly reduces or eliminates the depletion that occurs in the electrodes 22 and 32. Additionally, by providing conductive paths along the sides of the semiconductor electrodes 22 and 32, respectively, the barrier layers 26 and 30 allow the charge carriers within the electrodes 22 and 32 to more easily travel from one location to another, and thus significantly reduce the series resistance of the capacitor 20.

In another embodiment, one or both of the electrodes 22 and 32 may be formed from silicon germanium, which, as discussed above in conjunction with the capacitor 10 of FIG. 1, further reduces the leakage of the capacitor 20. Alternatively, the layers 22 and 32 may each include a layer of silicon germanium and a layer of another conductive material such as polysilicon. That is, for example, one of the layers 24a and 24b may be formed from silicon germanium and the other layer 24a and 24b formed from a conductive material such as polysilicon. Likewise, one of the layers 34a and 34b may be formed from silicon germanium, and the other layer 34a and 34b formed from another conductive material such as polysilicon.

Also, as discussed above in conjunction with FIG. 1, although shown having planar edges for clarity, in one embodiment, one or both of the electrodes 22 and 32 are formed with rough edges to increase their respective surface areas, thus increasing the capacitance of the capacitor 20. For example, the electrode 22, the electrode 32, or both may be formed entirely from HSG polysilicon, or one of the layers 24a and 24b of the electrode 22 or one of the layers and 34a and 34b of the electrode 32 may be formed from HSG polysilicon, and the other one of the respective layers 24a and 24b, and 34a and 34b, may be formed from silicon germanium or another conductive material.

In yet another embodiment, the capacitor 20 can be used as an antifuse as discussed above for the capacitor 10 of FIG. 1.

Figure 3:
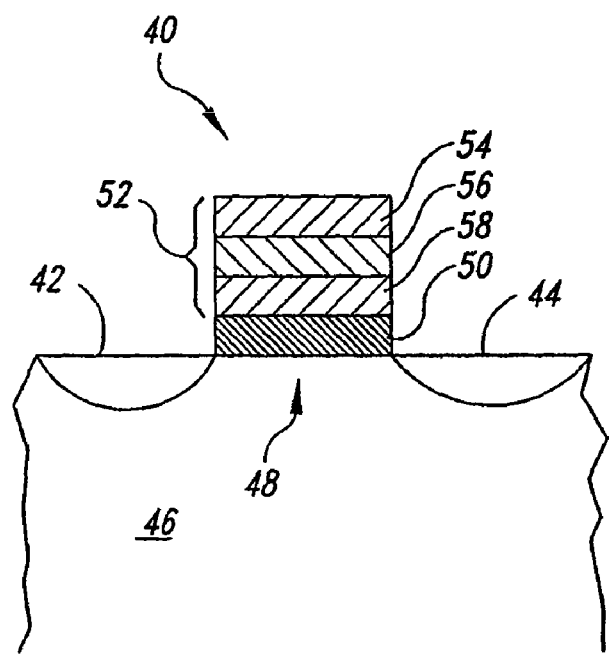
FIG. 3 is a cross-sectional view of a transistor having a gate structure that includes a barrier layer according to an embodiment of the invention.

FIG. 3 is a cross-sectional view of a transistor 40 according to another embodiment of the invention. The transistor 40 includes conventional source/drain regions 42 and 44, which are disposed in a substrate 46, a channel region 48, which is disposed in the substrate 46 between the source/drain regions 42 and 44, a conventional gate insulator 50, and a gate conductor 52, which includes a first conductive layer 54, a conductive barrier layer 56, and a second conductive layer 58. In one embodiment, the conductive layers 54 and 58 are formed from conventional materials. For example, the layer 54 may be a silicide layer and the layer 58 may be a polysilicon layer.

The barrier layer 56 prevents a dopant from diffusing from the layer 54, through the layer 58, and into the layer 50 during processing of the transistor 40. Where the layer 58 is a semiconductor material such as polysilicon, such diffusion can degrade the gate oxide 50 by causing mobile trapped charges that change the characteristics of the transistor 40, such as the threshold, and thus cause the transistor 40 to operate improperly for its intended use.

Because, as discussed above, conventional barrier materials such as tungsten silicide and titanium nitride are often not suited for the smaller geometries of today's denser integrated circuits, the barrier layer 56 is formed from tungsten nitride, tungsten silicon nitride, or titanium silicon nitride. These materials provide many advantages over conventional barrier materials. For example, the silicon component of tungsten silicon nitride and titanium silicon nitride allows transistor formation using a conventional "no spacer" process flow, which includes fewer steps and thus is cheaper to implement than other types of process flows. Furthermore, the silicon component of tungsten silicon nitride and titanium silicon nitride also increases the step coverage of these barrier materials as published by P.M. Smith et al., Chemical Vapor Deposition of Titanium-Silicon-Nitride Films, Applied Physics Letter 70 (23), American Institute of Physics, 9 Jun. 1997, pp. 3116-118. Although important at any geometry, step coverage becomes more important as the geometries shrink in size. Additionally, tungsten nitride, tungsten silicon nitride, and titanium silicon nitride are more compatible with conventional polysilicon electrodes, word lines, and interconnects than are tungsten silicide and titanium nitride. Moreover, because tungsten nitride, tungsten silicon nitride, and titanium silicon nitride have relatively high crystallization temperatures, they retain their barrier properties even after thermal cycling.

Figure 4:
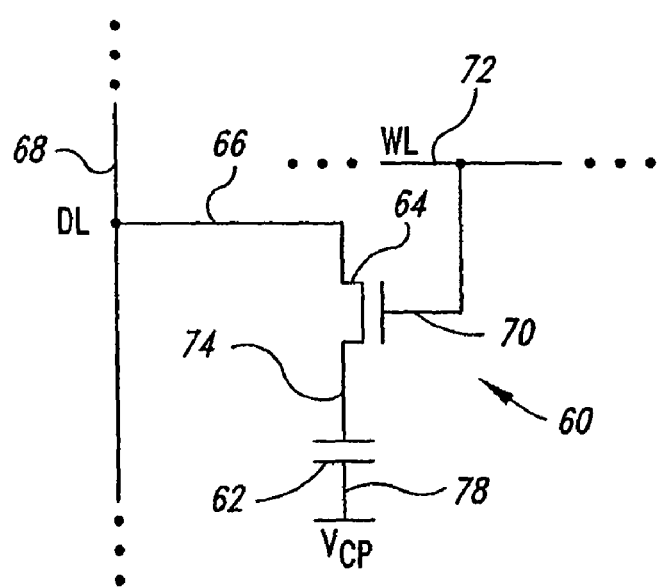
FIG. 4 is a schematic diagram of a DRAM cell that uses the capacitor of FIG. 1 or FIG. 2 or the transistor of FIG. 3.

FIG. 4 is a schematic diagram of a conventional DRAM cell 60, which includes a capacitor 62 and an access transistor 64. In one embodiment, the capacitor 42 has the same structure as either the capacitor 10 of FIG. 1 or the capacitor 20 of FIG. 2 and the transistor 64 is conventional. In another embodiment, the capacitor 62 is conventional and the transistor 64 has the same structure as the transistor 40 of FIG. 3. In yet another embodiment, the capacitor 42 has the same structure as either the capacitor 10 of FIG. 1 or the capacitor 20 of FIG. 2, and the transistor 64 has the same structure as the transistor 40 of FIG. 3. The access transistor 64 has an access terminal 66 coupled to a digit line 68, a gate 70 coupled to a word line 72, and a storage terminal 74 coupled to a data terminal 76 of the capacitor 62. A reference terminal 78 of the capacitor 42 is coupled to a conventional cell plate (not shown) that is biased at a cell-plate voltage VCP. In one embodiment, the capacitor plate that composes the reference terminal 78 is actually integral with the cell plate. That is, the cell plate acts as the respective terminals/plates 78 for all of the capacitors 62 coupled thereto. Typically, VCP is half of the supply voltage that powers a circuit that includes the cell 60.

Figure 5:
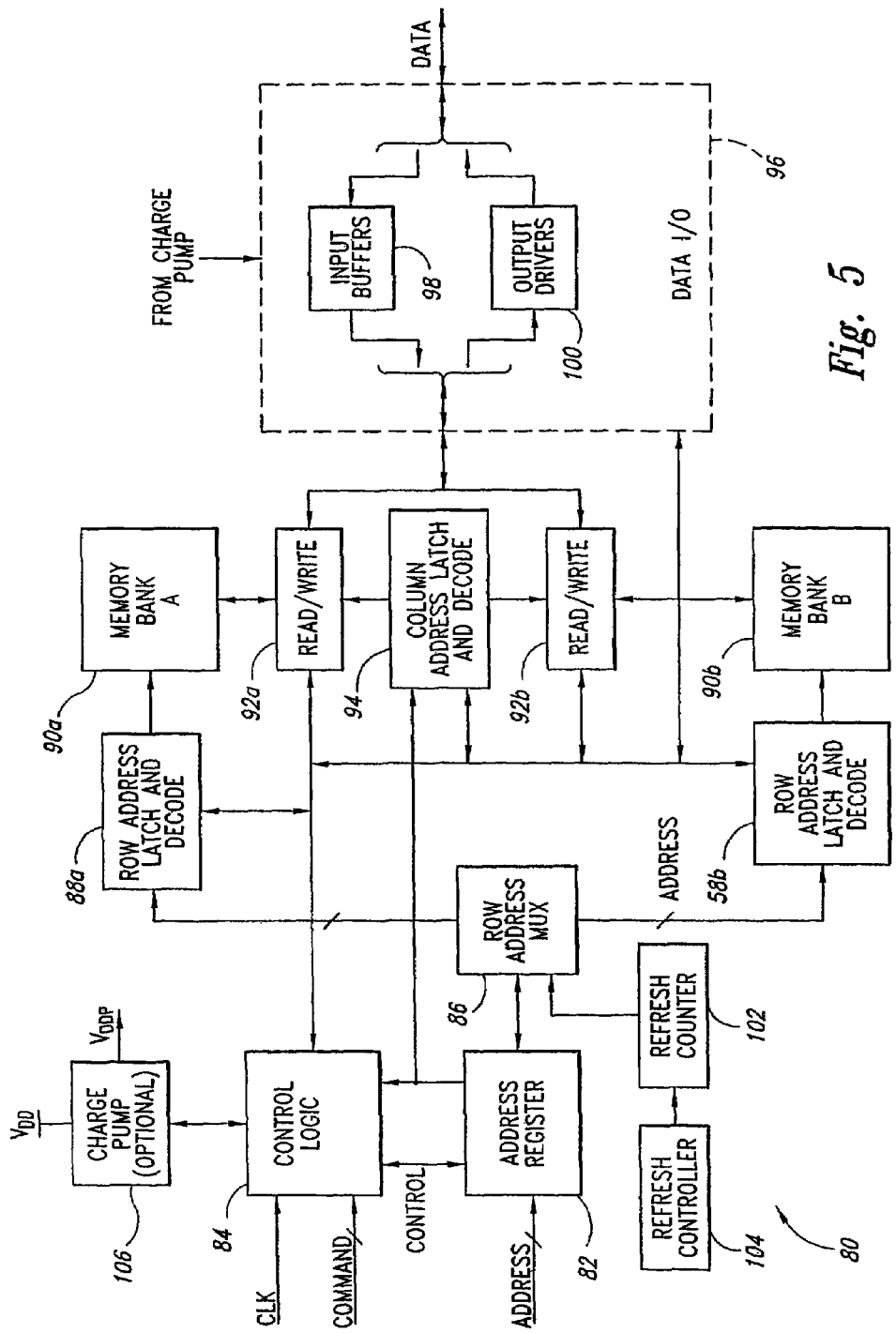
FIG. 5 is a block diagram of a memory circuit that can incorporate the capacitors of FIGS. 1 and 2, the transistor of FIG. 3, or the DRAM cell of FIG. 4.

FIG. 5 is a block diagram of a memory circuit 80, which can include the capacitor 10 or the capacitor 20 of FIGS. 1 and 2, respectively, the transistor 40 of FIG. 3, the DRAM cell 60 of FIG. 4, or a combination or subcombination of these components.

The memory circuit 80 includes an address register 82, which receives an address from an ADDRESS bus. A control logic circuit 84 receives a clock (CLK) signal, and receives clock enable (CKE), chip select (CS), row address strobe (RAS), column address strobe (CAS), and write enable (WE) signals from a COMMAND bus, and generates control signals for controlling the operation of the memory device 80. A row address multiplexer 86 receives the address signal from the address register 82 and provides the row address to row-address latch-and-decode circuits 88a and 88b for one of two memory banks 90a and 90b, respectively. The memory banks 90a and 90b each include a large number of DRAM cells 60 (FIG. 4) using one or more of several embodiments of the invention, as explained above. During read and write cycles, the row-address latch-and-decode circuits 88a and 88b activate the word lines of the addressed rows of memory cells in the memory banks 90a and 90b, respectively. Read/write circuits 92a and 92b read data from the addressed memory cells in the memory banks 90a and 90b, respectively, during a read cycle, and write data to the addressed memory cells during a write cycle. A column-address latch-and-decode circuit 94 receives the address from the address register 82 and provides the column address of the selected memory cells to the read/write circuits 92a and 92b. For clarity, the address register 82, the row-address multiplexer 86, the row-address latch-and-decode circuits 88a and 88b, and the column-address latch-and-decode circuit 94 can be collectively referred to as an address decoder.

A data input/output (I/O) circuit 96 includes a plurality of input buffers 98. During a write cycle, the buffers 98 receive and store data from the DATA bus, and the read/write circuits 92a and 92b provide the stored data to the memory banks 90a and 90b, respectively. The data I/O circuit 96 also includes a plurality of output drivers 100. During a read cycle, the read/write circuits 92a and 92b provide data from the memory banks 90a and 90b, respectively, to the drivers 100, which in turn provide this data to the DATA bus.

A refresh counter 102 stores the address of the row of memory cells to be refreshed either during a conventional auto-refresh mode or self-refresh mode. After the row is refreshed, a refresh controller 104 updates the address in the refresh counter 102, typically by either incrementing or decrementing the contents of the refresh counter 102 by one. Although shown separately, the refresh controller 104 may be part of the control logic 84 in other embodiments of the memory device 80.

The memory device 80 may also include an optional charge pump 106, which steps up the power-supply voltage VDD to a voltage VDDP. In one embodiment, the pump 106 generates VDDP approximately 1-1.5 V higher than VDD. The memory circuit 80 may also use VDDP to conventionally overdrive selected internal transistors.

Figure 6:
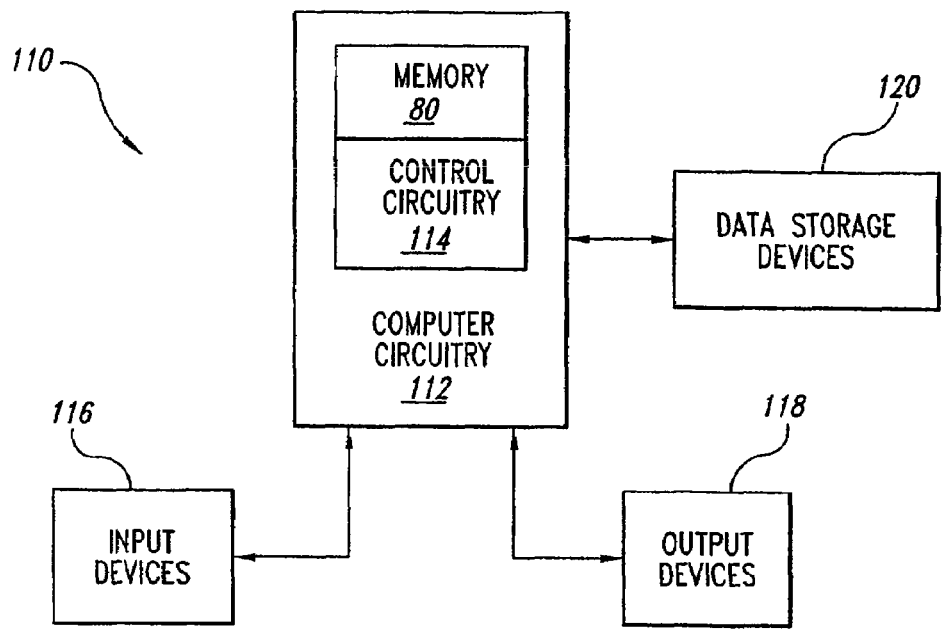
FIG. 6 is a block diagram of a computer system that incorporates the memory circuit of FIG. 5.

FIG. 6 is a block diagram of an electronic system 110, such as a computer system, which incorporates the memory circuit 80 of FIG. 5. The system 110 includes computer circuitry 112 for performing computer functions, such as executing software to perform desired calculations and tasks. The circuitry 112 typically includes a processor 114 and the memory circuit 80, which is coupled to the processor 114. One or more input devices 116, such as a keyboard or a mouse, are coupled to the computer circuitry 112 and allow an operator (not shown) to manually input data thereto. One or more output devices 118 are coupled to the computer circuitry 112 to provide to the operator data generated by the computer circuitry 112. Examples of such output devices 118 include a printer and a video display unit. One or more data-storage devices 120 are coupled to the computer circuitry 112 to store data on or retrieve data from external storage media (not shown). Examples of the storage devices 120 and the corresponding storage media include drives that accept hard and floppy disks, tape cassettes, and compact disk read-only memories (CD-ROMs). Typically, the computer circuitry 112 includes address data and command buses and a clock line that are respectively coupled to the ADDRESS, DATA, and COMMAND buses, and the CLK line of the memory device 80.

Figure 7:
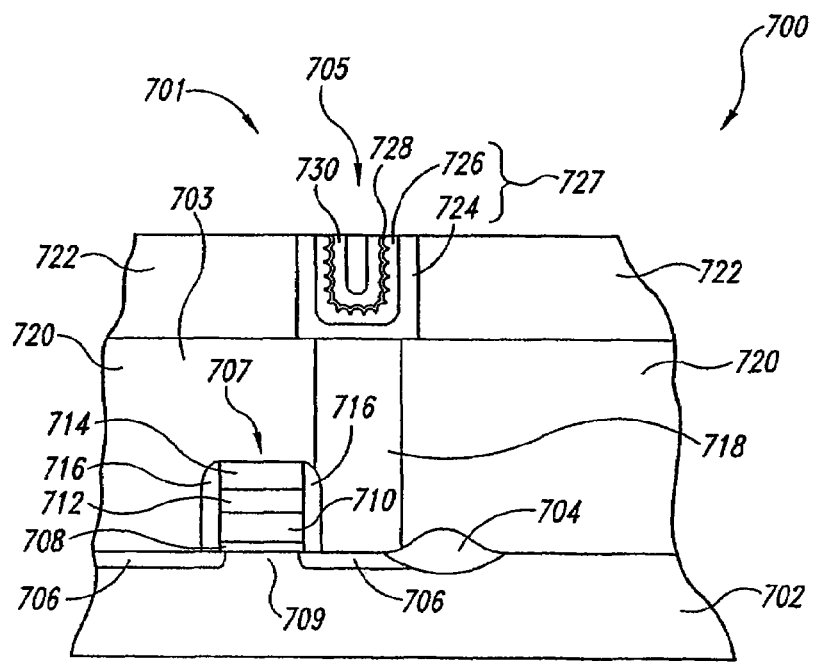
FIG. 7 is a cross-sectional view of a conventional semiconductor structure.

FIG. 7 is a cross-sectional view of a conventional semiconductor structure 700 including a memory cell 701, which comprises a transistor 703 electrically coupled to a capacitor 705 via a plug 718. The transistor 703 is built on a substrate 702 and is isolated from other transistors (not shown) by a field oxide layer 704. The transistor 703 includes highly doped areas 706 that act as source or drain regions, and also includes a gate stack 707, which controls the flow of charge carriers through a channel region 709 defined between the highly doped areas 706. The gate stack 707 includes a gate oxide layer 708, a polycrystalline silicon gate layer 710, a silicide layer 712, a gate cap layer 714, and spacers 716.

A nonconductive layer 720 electrically isolates the transistor 703 and structurally supports the capacitor 705, and nonconductive layer 722 surrounds the capacitor 705 to electrically isolate it from other semiconductor devices (not shown). The capacitor 705 comprises a substrate 724, which may be made from polysilicon-germanium; a hemispherical silicon grain (HSG) layer 726 is formed adjoining the substrate 724, and may be formed from a germanium-doped amorphous silicon layer. The substrate 724 together with the HSG layer 726 forms a bottom electrode 727 of the capacitor 705. A dielectric layer 728 is formed conforming to the HSG layer 726, and a top electrode layer 730 is formed on the dielectric layer 728.

As previously discussed with reference to FIGS. 1 and 2, the HSG layer 726 increases the surface areas of the bottom electrode 727 and ton electrode layer 730 of capacitor 705, and hence, increases its capacitance. The significance of this increased surface areas by the HSG layer 726 may be understood by revisiting the physics of a capacitor in the context of the trend of ongoing miniaturization of semiconductor devices: A measure of the ability of the capacitor to store charge is called capacitance. The capacitance is given by $\in A/d$, where $\in$ is the permittivity of the dielectric, A is the area of the electrodes, and d is the distance separating the electrodes. Both the area A and the distance d of the capacitor define the physical dimensions of the capacitor, and as the area A increases the capacitance, the ability of the capacitor to store charge also increases.

Capacitors of memory cells are built in limited space so as to comport with the ongoing trend of miniaturization of semiconductor devices. Even with such physical constraints, the capacitance of these capacitors must be kept high to store sufficient charge and avoid excessive dissipation of charge over time. One technique to raise the capacitance is to increase the area A by roughening the surface of an electrode of the capacitor. This roughening process forms hemispherical protrusions (or grains) that protrude from the surface of the electrode. The curvature surface of each grain provides a greater area than the flat surface of the electrode from which each grain protrudes. Thus, the combined surface areas of the grains increase the area A of the electrode and thereby raise the capacitance of the capacitor.

The resulting roughened surface is also known as an HSG (hemispherical silicon grain) layer. While the HSG layer helps to increase capacitance, a further increase in capacitance may be desired as the space in which the capacitor is formed continues shrinking. Moreover, during formation of the HSG layer 726, atoms in a previously deposited layer are consumed to form the hemispherical protrusions and thereby form the HSG layer, as will be understood by those skilled in the art. Atoms in the underlying electrode layer 724 may also be consumed during formation of the HSG layer 726. Unwanted holes in the HSG layer 726 and electrode layer 724 may result as such atoms are consumed from each layer, and such holes can allow underlying regions to be damaged during subsequent processing steps. This limits the ability to form large hemispherical protrusions on the layer 726 to increase the area of the layer.

Figure 8:
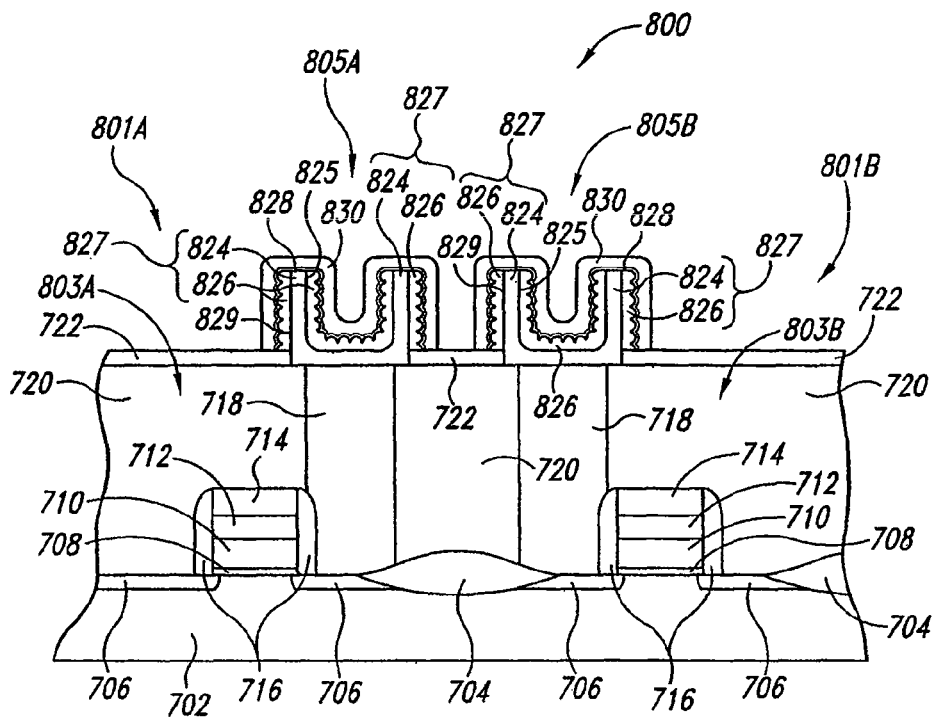
FIG. 8 is a cross-sectional view of a semiconductor structure according to one embodiment of the present invention.

FIG. 8 is a cross-sectional view of a semiconductor structure 800 according to one embodiment of the present invention The semiconductor structure 800 includes a memory cell 801A, which comprises a transistor 803A coupled through the corresponding plug 718 to a capacitor 805A, and a memory cell 801B, which comprises a transistor 803B coupled through the corresponding plug 718 to a capacitor 805B. Some of the structural details and components of the memory cells 801A and 801B are similar to those discussed with reference to FIG. 7, and for the sake of brevity, such components have been given the identical reference numerals as corresponding components in FIG. 7. These components and structural details will not again be discussed in detail.

In FIG. 8, the capacitor 805A includes a first polycrystalline electrode layer 824 formed to contact the corresponding plug 718 and an HSG layer 826 formed on an inner surface 825 of the first polycrystalline electrode layer. The first polycrystalline electrode layer 824 and HSG layer 826 together form a bottom electrode 827 of the capacitor 805A. The first polycrystalline electrode layer 824 prevents damage to underlying regions if openings or perforations in the HSG layer 826 occur during formation of that layer, as will be described in more detail below. In one embodiment, the HSG layer is formed from an undoped amorphous silicon layer, as will be discussed in more detail below. In the structure 800, some of the nonconducting layer 722 is removed to expose an outer surface 829 of the electrode layer 824, and the HSG layer 826 is also formed on the outer surface 829. A dielectric layer 828 is then formed on the HSG layer 826 and on an upper portion 831 of the electrode layer 824. A top electrode layer 830 is formed on the dielectrode layer 828. Each of the layers 826-830 may be formed from the same materials as the corresponding layers in the structure of FIG. 7 or other suitable materials as will be understood by those skilled in the art. The capacitor 805B has the same structure as that just described for the capacitor 805A, and thus, for the sake of brevity, will not be described in more detail. The capacitors 805A and or 805B have increased respective capacitance values due to the increased areas of the bottom electrode 827 and top electrode layer 830. The use of both the inner and outer surfaces of the first polycrystalline electrode layer 824 along with the HSG layer 826 deposited thereon increases the surface area of the bottom electrode 827 which, in turn, increases the surface areas of the dielectric layer 828 and top electrode layer 830. Thus, the capacitors 805A, 805B have increased capacitance values relative to the conventional capacitors 705 due to the increased areas of the bottom electrode 827 and top electrode layer 830

Figure 9:
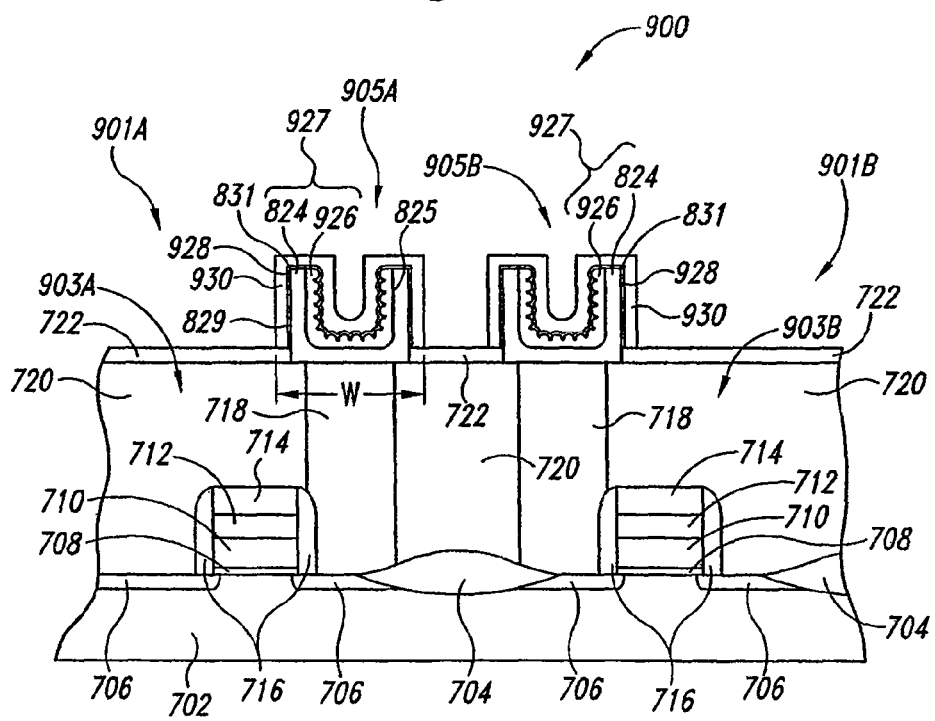
FIG. 9 is a cross-sectional view of a semiconductor structure according to one embodiment of the present invention.

FIG. 9 is a cross-sectional view of a semiconductor structure 900 according to another embodiment of the present invention. The semiconductor structure 900 includes a memory cell 901A, including a transistor 903A coupled to a capacitor 905A, and a memory cell 901B including a transistor 903B coupled to a capacitor 905B. Some of the structural details and components of the memory cells 901A and 901B are similar to those discussed in FIG. 8, and for the sake of brevity, such components have been given identical reference numerals, as corresponding components in FIG. 8. These components and structural details will not again be discussed in detail.

The capacitors 905A and 905B are identical, and thus only the capacitor 905A will be discussed in more detail. In the embodiment of FIG. 9, the capacitor 905A once again includes the first electrode layer 824 formed to contact the corresponding plug 718 and an HSG layer 926 formed on the inner surface 825 of the first electrode layer. A portion of the nonconductive layer 722 is again removed to expose an outer surface 829 of the first polycrystalline electrode layer 824. A dielectric layer 928 is then formed at the outer surface 829 and on the upper portion 831 of the first polycrystalline electrode layer 824, and is also formed on the HSG layer 926. A top electrode layer 930 is then formed on the dielectric layer 928. In the capacitor 905A, the first polycrystalline electrode layer 824 and HSG layer 926 form a bottom electrode 927 of the capacitor. The bottom electrode 927 and top electrode layer 930 have increased areas relative to the bottom electrode 727 and top electrode layer 730 in the conventional capacitor 705 of FIG. 7. These increased areas are due to the area added by the use of the outer surface 829 of the first electrode layer 824. By omitting the formation of the HSG layer 926 on the outer surface 829 of the layer 824, the structure of the capacitor 905A provides an increased capacitance while having a relatively small width W, which allows the capacitors 905A, 905B to be more densely formed, as will be appreciated by those skilled in the art.

FIGS. 10A-10K are cross-sectional views of the semiconductor structure 900 during processing according to one embodiment of the present invention. FIGS. 10A-10G illustrate the formation of the HSG layer 926 via an in-situ processing technique while FIGS. 10H-10K illustrate the formation of the HSG layer via an ex-situ processing technique. The discussion in FIGS. 10A-10K illustrates a few of the steps associated with a sample fabrication process. The entire fabrication process is not discussed so as to focus on the embodiments of the present invention, and one skilled in the art will understand such overall fabrication processes and appreciate various other methods of fabrication that may be utilized in forming the structures 800 and 900. One skilled in the art will also appreciate various fabrication processes that may be utilized in forming the capacitor 805A, 805B and the structure 800 of FIG. 8. For the sake of clarity, many of the reference numbers in FIGS. 10A-10K, once discussed, may be eliminated from subsequent drawings.

In the in-situ process of FIGS. 10A-10G, FIG. 10A is a cross-sectional view of the semiconductor structure 900 during processing and illustrates that the nonconductive layer 722 is etched to form openings 1000A and 1000B, each opening defining a container, which will house a corresponding capacitor 905A, 905B. The other semiconductor elements in FIG. 10A, such as the transistors 703 and plugs 718, are formed using conventional techniques, and thus their formation will not be described in detail. Briefly, the gate oxide 708 is grown over the channel region 707 of the substrate 702, which can be formed from any suitable substance, such as lightly doped n-type or p-type material and a lightly doped epitaxial layer on a heavily doped substrate. The field oxide layer 704 may be deposited, patterned, and etched on the substrate 702 and the polycrystalline silicon gate 710 formed by depositing a polycrystalline silicon layer over the gate oxide layer 708 and then photolithographed and etched appropriately. Impurities of the appropriate kind are implanted or otherwise introduced into the substrate 702 to form the highly doped source and drain regions 706. The silicide layer 712 is formed on the polycrystalline silicon gate 710 to create a metal/semiconductor junction. The gate cap layer 714 and spacers 716 are formed by depositing a dielectric layer which is then photolithographed and etched. The nonconductive layer 720 is formed over these components and the plugs 718 are formed in the nonconductive layer to electrically contact the highly doped areas 706. The nonconductive layer 722, such as borophosphorus silicate glass (BPSG), is deposited over the nonconductive layer 720.

Figure 10A:
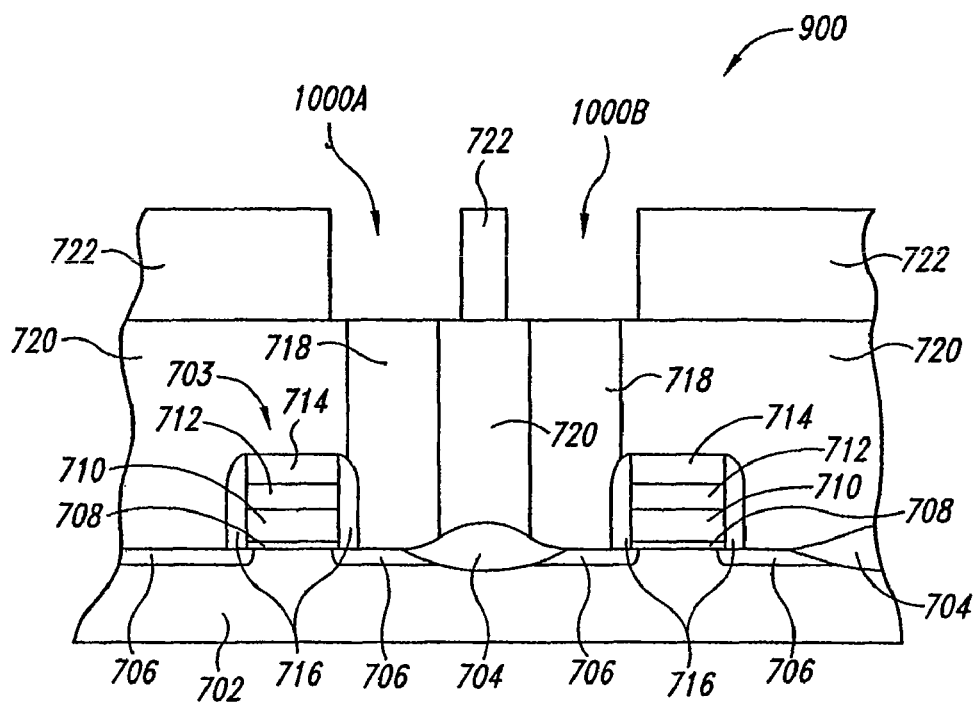
FIGS. 10A-10G are cross-sectional views of a semiconductor structure undergoing an in-situ processing technique according to one embodiment of the present invention.
Figure 10B:
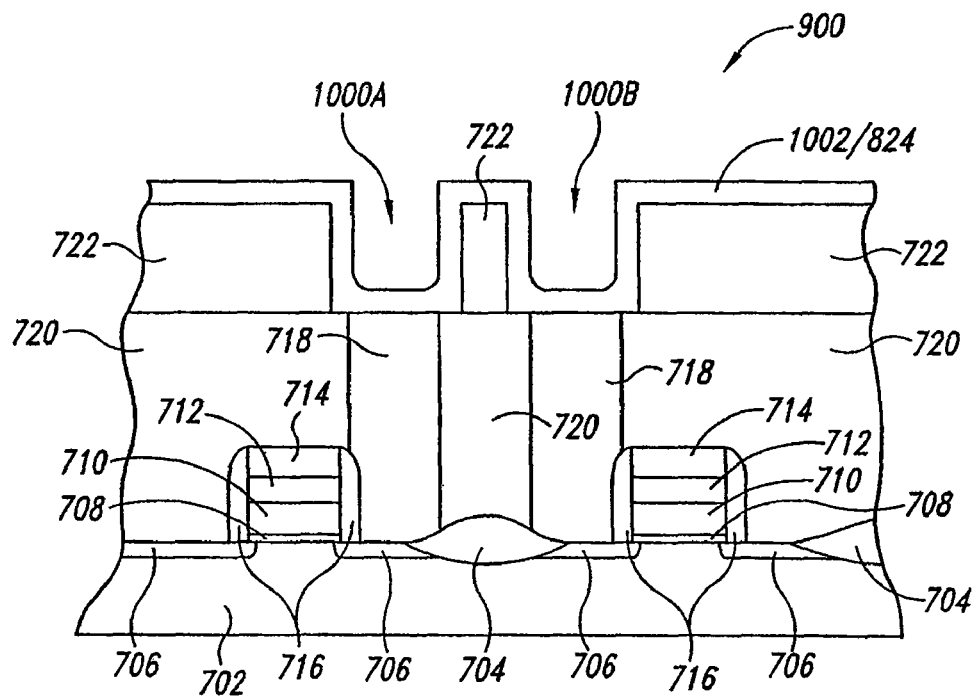

FIG. 10B is a cross-sectional view of the semiconductor structure 900 during the next sequence of in-situ processing in which a conductive layer 1002 is deposited over the nonconductive layer 722 and into the openings 1000A and 1000B. The conductive layer 1002 can be of any suitable material that will form a polycrystalline structure so that the majority of atoms are sufficiently bound to resist being drawn out of the layer 1002 and contributing to the formation of the HSG layer 926, as will be discussed in more detail hereinbelow. This conductive layer 1002 will be part of the bottom electrode 927 of the two capacitors 905A, 905B, housed in the openings

1000A and 1000B, respectively. One suitable material for the layer 1002 includes a silicon-germanium alloy. The deposition process of the silicon-germanium alloy includes low-pressure chemical-vapor deposition, which forms the silicon-germanium alloy to a thickness of less than about 500 angstroms. In such a deposition process, at a temperature greater than about 500 degrees Celsius, silane gas ($Si_nH_{2n+2}$) is allowed to flow along with phosphine gas ($PH_3$) and digermanium hexahydride ($Ge_2H_6$) or germanium tetrahydride ($GeH_4$) on the surface of the nonconductive material 722 including the openings 1000A and 1000B. The silicon-germanium alloy will become polycrystalline at about 500 degrees Celsius during this sequence of processing. Because of the transformation the layer 1002 from the silicon-germanium alloy to a polycrystalline structure, the conductive layer 1002 is also designated 824, which is the reference number used to refer to this polycrystalline electrode layer in FIGS. 8 and 9.

Figure 10C:
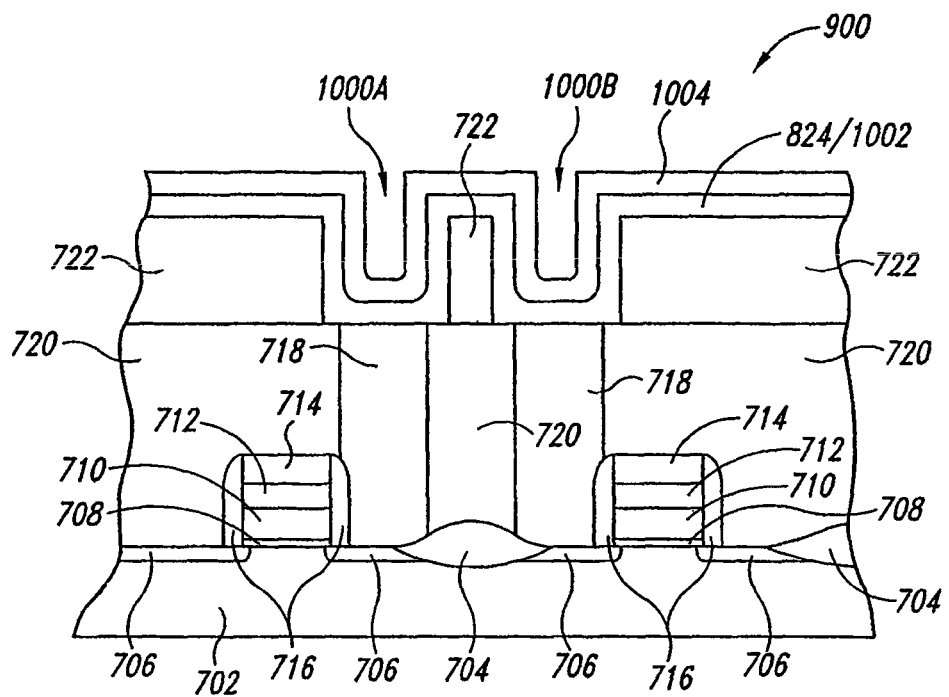

FIG. 10C is a cross-sectional view of the semiconductor structure 900 during the next sequence of in-situ processing. After the transformation of the silicon-germanium alloy 1002 into the polycrystalline electrode layer 824, silane gas is again allowed to flow to deposit an undoped amorphous silicon layer 1004 at an appropriate temperature. In one embodiment, the temperature is less than about 550 degrees Celsius, in another embodiment the temperature is less than about 450 degrees Celsius, and in yet another embodiment the temperature is about 300 degrees Celsius. This deposition process forms the undoped amorphous silicon layer 1004 at a thickness less than about 500 angstroms.

Figure 10D:
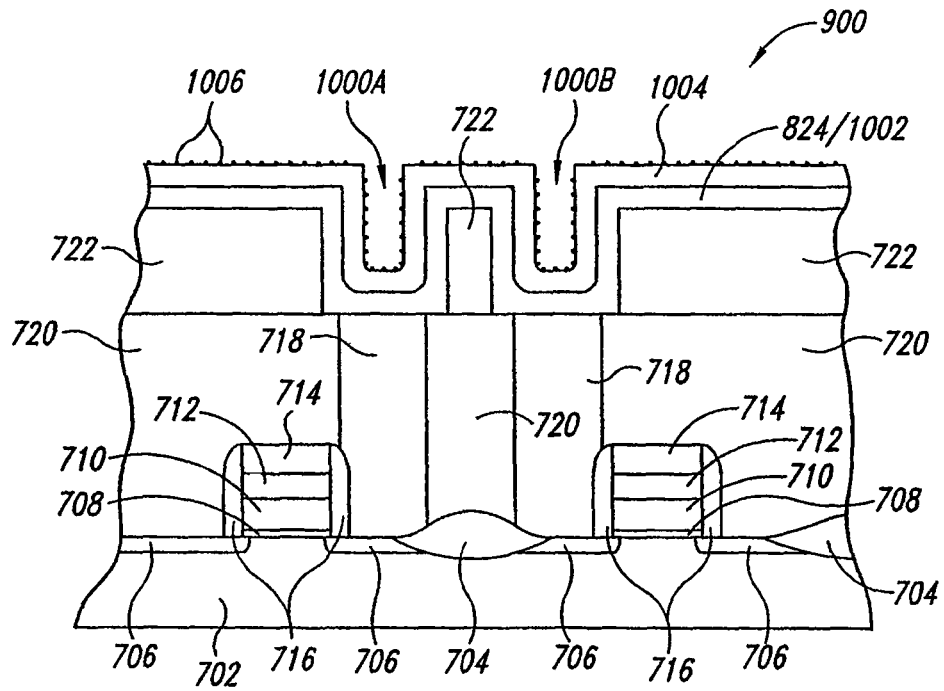

FIG. 10D is a cross-sectional view of the semiconductor structure 900 during the next sequence of in-situ processing in which the undoped amorphous silicon layer 1004 undergoes a seeding process to form a number of seeds 1006 on the surface of the undoped amorphous silicon layer 1004. The seeding process begins by bathing the surface of the undoped amorphous silicon layer 1004 in silane gas at a flow rate greater than about 10 standard cubic centimeters per minute and less than about 30 standard cubic centimeters per minute. The temperature should be raised to greater than about 550 degrees Celsius and less than about 600 degrees Celsius. The seeding process is a precipitation of solids from a gaseous matrix to form the seed 1006. Nucleation is the first step of the seeding process, and it describes the clustering of silicon atoms on the surface of the undoped amorphous silicon layer 1004 to randomly produce many nuclei or seeds 1006. Those seed 1006 that are larger than a certain size are stable and as a result can participate in the growing process, which will be described in more detail below.

Figure 10E:
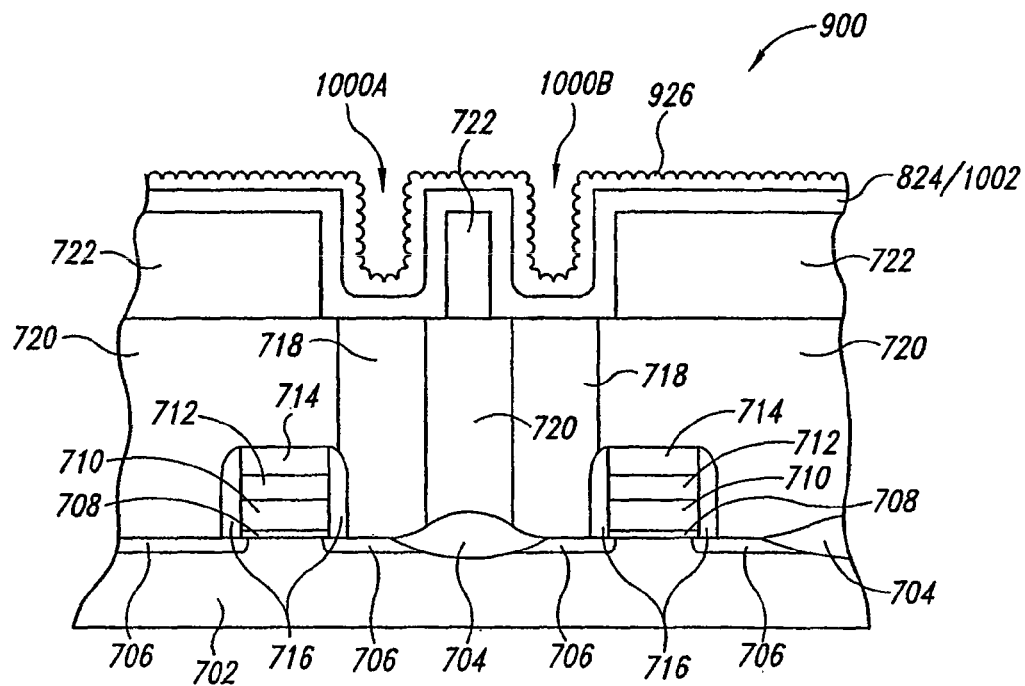

FIG. 10E is a cross-sectional view of the semiconductor structure 900 during the next sequence of in-situ processing in which the semiconductor structure 900 undergoes an annealing process, which causes the seeds 1006 (FIG. 10D) to grow into hemispherical protrusions and thereby transform the layer 1004 and seed 1006 into the HSG layer 926. The annealing process is at a temperature that allows silicon atoms from the undoped amorphous silicon layer 1004, which are within the vicinity of the seeds 1006, to be drawn into the seeds 1006. As more and more silicon atoms are drawn into the seeds 1006, the seeds 1006 begin to grow and forms the hemispherical protrusions on the HSG layer 926 as discussed above. The annealing process preferably occurs for about 30 minutes at a temperature greater than about 550 degrees Celsius and less than about 600 degrees Celsius.

Depending on the thickness of the undoped amorphous silicon layer 1004, too many of the atoms from the undoped amorphous silicon layer 1004 may participate in the growing of the hemispherical protrusions, and thus, may lead to the formation of undesired perforations in the HSG layer 926. The perforations may allow etching solutions, which are used in subsequent processing steps, to leak through and damage underlying components of the semiconductor structure 900. Because of the presence of the polycrystalline layer 824, however, even if such perforations in the HSG layer 926 occur, the polycrystalline layer 824 protects the semiconductor structure 900 from any damage due to the leakage of etchant solutions through the perforations. The atoms in the polycrystalline layer 824, as explained above, are bound sufficiently in the layer 824 so that most of the atoms will not be drawn into the HSG layer 926 during the growing of the hemispherical protrusions on the HSG layer 926. Thus, the polycrystalline layer 824 remains intact during the annealing process so as to provide a protective barrier should undesired perforation of the HSG layer 926 occur.

Figure 10F:
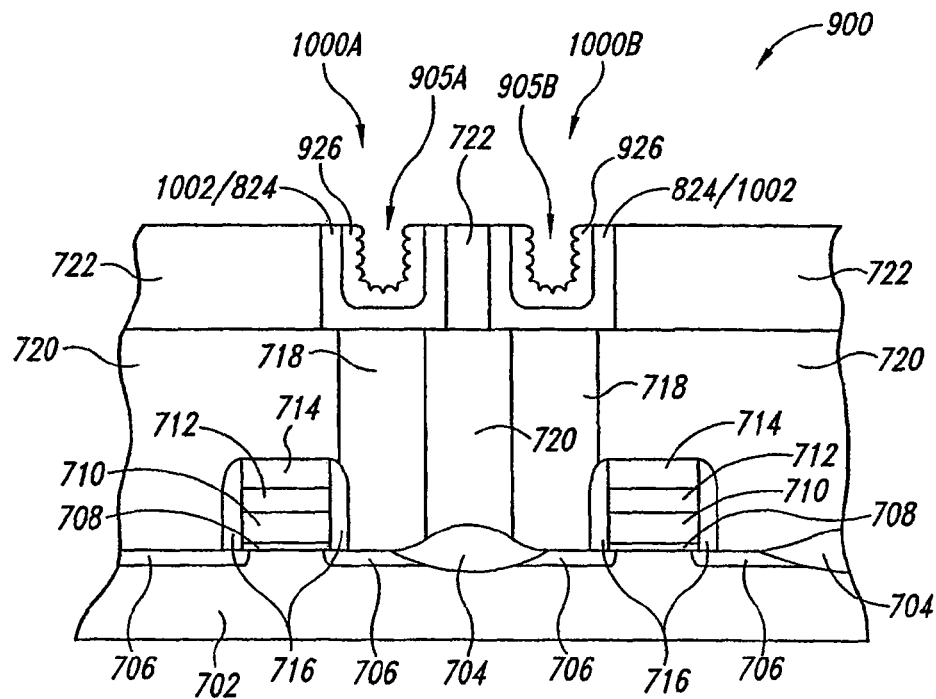

FIG. 10F is a cross-sectional view of the semiconductor structure 900 during the next sequence of in-situ processing in which the semiconductor structure 900 as shown in FIG. 10E undergoes a chemical-mechanical planarization process to remove portions of the HSG layer 926 and layer 824. The planarization process removes the HSG layer 926 except for the portions of that layer in the openings 1000A and 1000B, and also removes most of the polycrystalline layer 824. The structure resulting after the chemical-mechanical planarization process is illustrated in FIG. 10F.

Figure 10G:
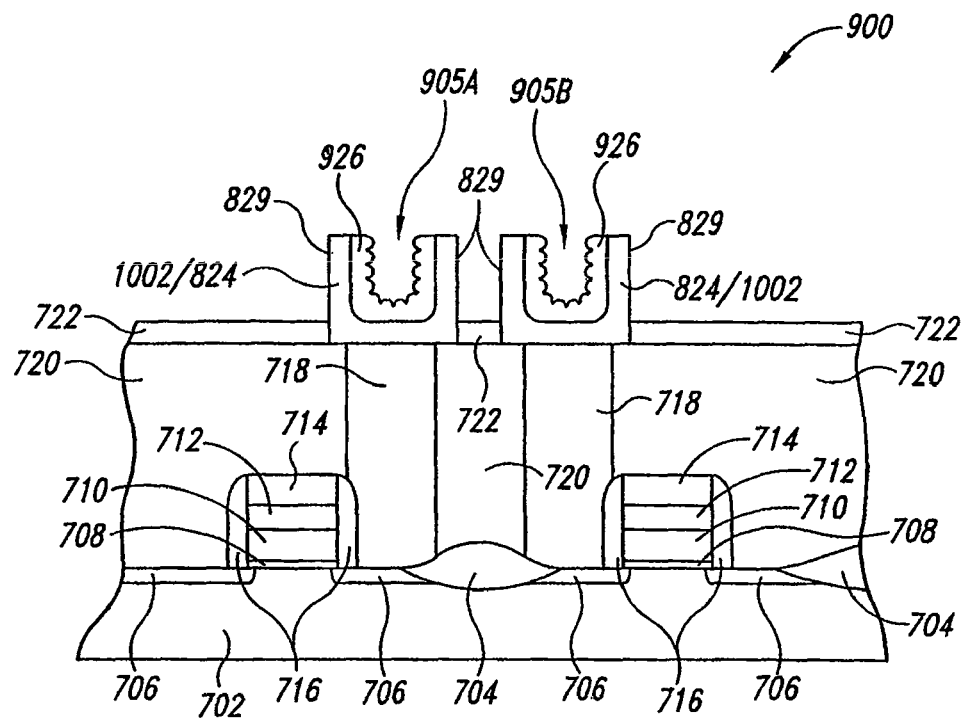

FIG. 10G is a cross-sectional view of the semiconductor structure 900 during the next sequence of in-situ processing in which the semiconductor structure 900 is photolithographed and etched so that most of the nonconductive layer 722 is removed to expose the outer surfaces 829 of the polycrystalline electrode layer 824 as shown. The etching process includes an etch-back process, which uses an etching solution formed from a 10:1 ratio of water to hydrofluoric acid. The remaining steps to complete the formation of the capacitors 905A and 905B are conventional, and thus, for the sake of brevity, will not be described in detail. For example, the deposition of the dielectric layer 928 (See FIG. 9) over the HSG layer 926 is followed by a deposition of a conductive material over the dielectric layer to form the top electrode layer 930 to complete the formation of the capacitors 905A, 905B of FIG. 9.

What has been discussed with reference to FIGS. 10A-10G involves the formation of the HSG layer 926 via an in-situ process. What will be discussed below with reference to FIGS. 10H-10K illustrates the formation of the HSG layer 926 via an ex-situ process. The ex-situ process begins similarly to the in-situ process with the formation of the openings 1000A and 1000B as discussed in FIG. 10A, which is followed by the formation of the conductive layer 1002 as discussed in FIG. 10B, and the formation of the undoped amorphous silicon layer 1004 as discussed in FIG. 10C. The similarity between the in-situ and ex-situ processes ends there.

Figure 10H:
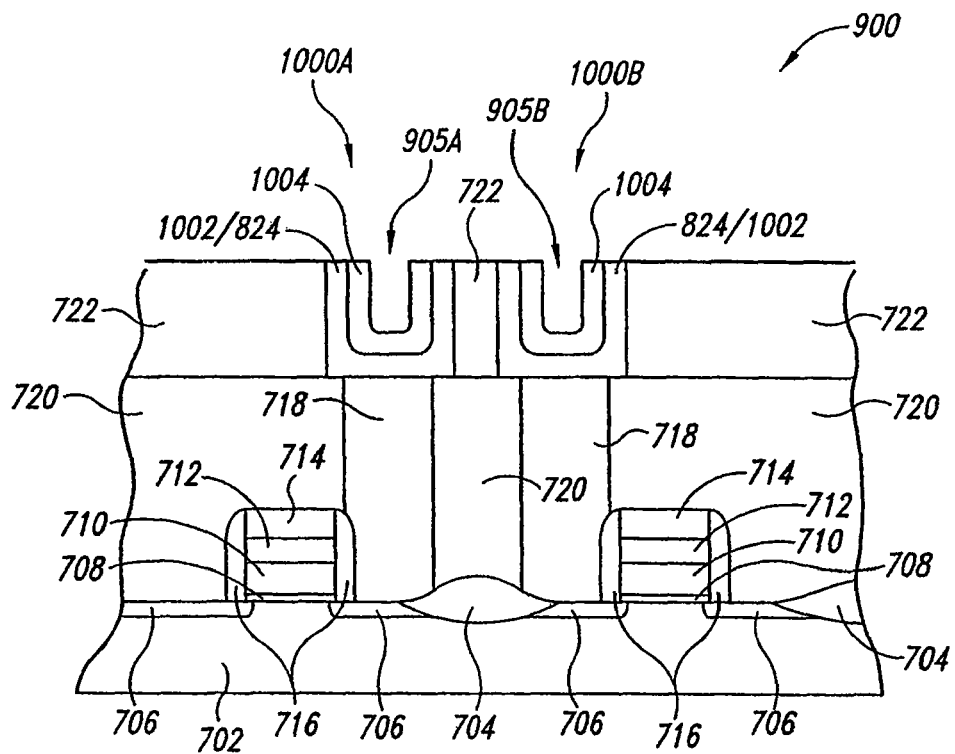
FIGS. 10H-10K are cross-sectional views of a semiconductor structure undergoing an ex-situ processing technique according to one embodiment of the present invention.

The ex-situ process of forming the HSG layer 926 is shown in FIGS. 10H-10K. FIG. 10H is a cross-sectional view of the semiconductor structure 900 during a sequence of ex-situ processing in which the semiconductor structure 900 of FIG. 10C undergoes a chemical-mechanical planarization process to remove the polycrystalline layer 824 and the undoped amorphous silicon layer 1004 except for the portions of these layers in the openings 1000A and 1000B.

Figure 10I:
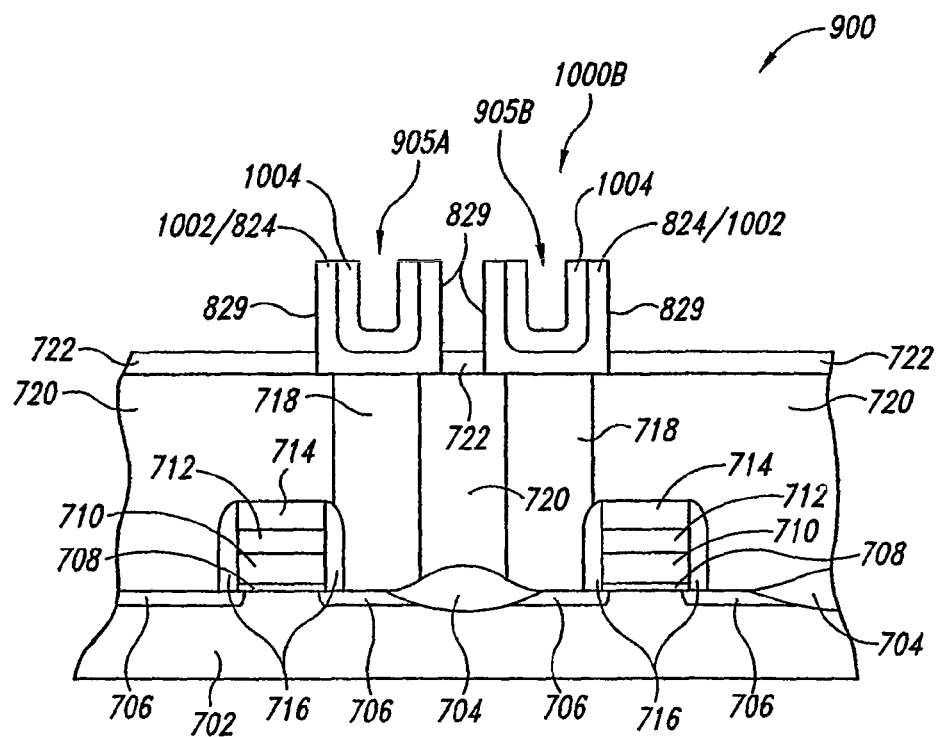

FIG. 10I is a cross-sectional view of the semiconductor structure 900 during the next sequence of ex-situ processing in which the semiconductor structure of FIG. 10H is photolithographed and etched to remove most of the nonconductive layer 722 and expose the outer surfaces 829 of the polycrystalline electrode layer 824. The etching process includes an etch-back process, which uses an etching solution formed from a 10:1 ratio of water to hydrofluoric acid.

Figure 10J:
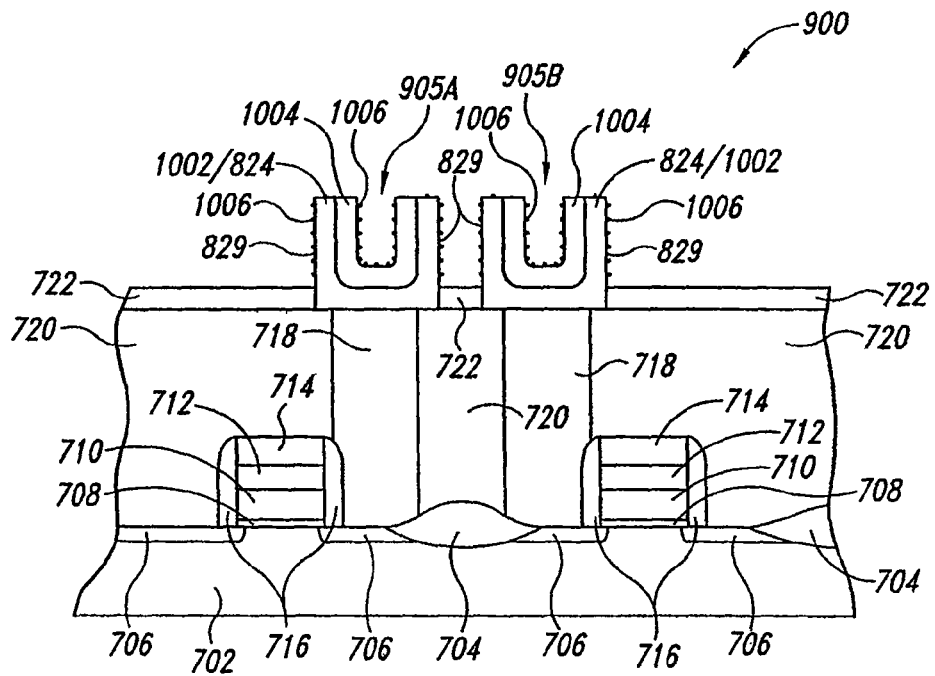

The next step of the ex-situ process is shown in FIG. 10J, which illustrates a seeding process being applied to form a number of seeds 1006 on the surface of the undoped amorphous silicon layer 1004. The undoped amorphous silicon layer 1004 is bathed in silane gas at a flow rate greater than about 15 standard cubic centimeters per minute. The temperature should be raised to greater than about 600 degrees Celsius and less than about 650 degrees Celsius. Because the outer surfaces 829 of the polycrystalline layer 824 are exposed, the seeds 1006 are formed on both the surfaces of the undoped amorphous silicon layer 1004 and on the surfaces of the polycrystalline layers 824.

Figure 10K:
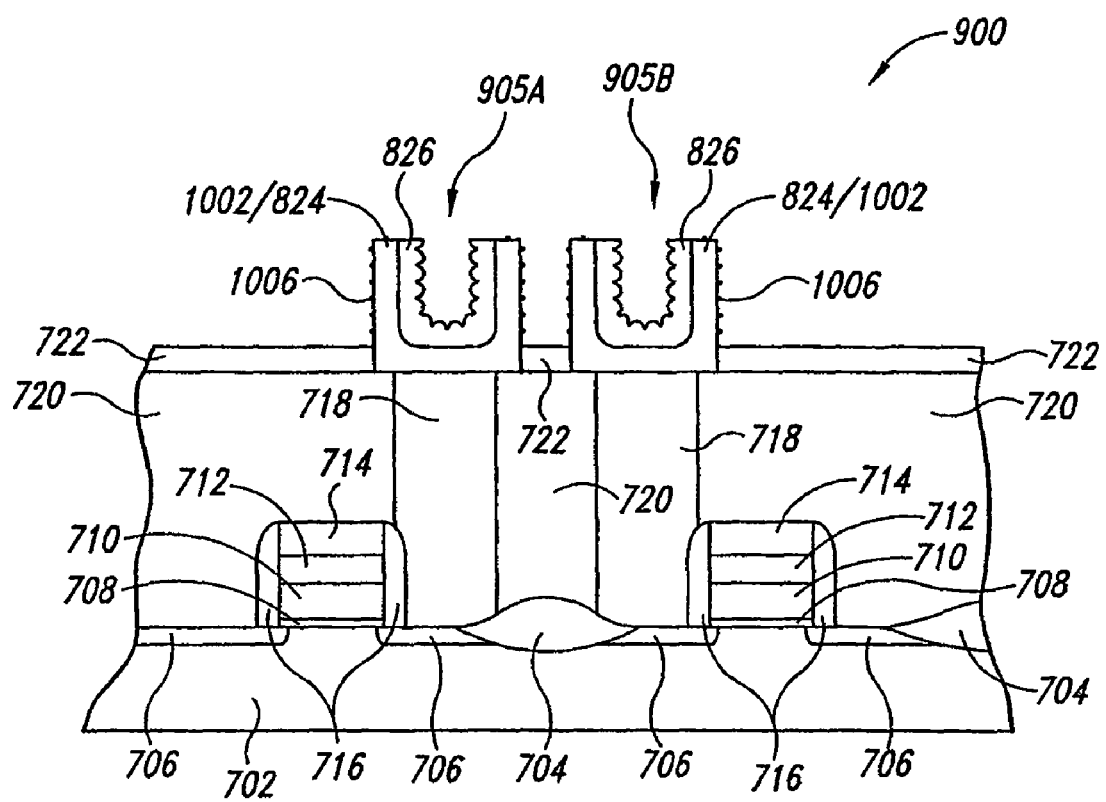

FIG. 10K shows the next sequence of the ex-situ process in which the semiconductor structure 900 undergoes a high-vacuum annealing process so as to grow the seeds 1006 as shown in FIG. 10J into hemispherical protrusions and thereby form the HSG layers 926. In one embodiment, the annealing process occurs for about five minutes at a temperature greater than about 600 degrees Celsius and less than about 650 degrees Celsius. As discussed above, the atoms in the polycrystalline layer 824 are sufficiently bound in the layer 824 so that most of the atoms will not participate in the growing of the hemispherical protrusions. As a result, the seeds 1006 on the surface of the polycrystalline layer 824 are unlikely to grow significantly, and the surface of the polycrystalline layer 824 remains relatively smooth. The polycrystalline layer 824 once again acts as a protective barrier to protect regions underlying the layer 824 should undesired perforation of the HSG layer 926 occur. The remaining steps to complete the formation of the capacitors 905A and 905B are conventional, and thus will not be described in detail. For example, the deposition of the dielectric layer 928 (FIG. 9) over the HSG layer 926 is followed by a deposition of a conductive material over the dielectric layer to form as the top electrode layer 930 and complete the formation of the capacitors 905A, 905B of FIG. 9.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A transistor comprising:
    a substrate having source and drain regions and a channel region disposed between the source and drain regions;
    an insulative layer disposed on the substrate between the source and drain regions; and
    a conductive layer disposed on the insulative layer, the conductive layer having a barrier layer and a semiconductor layer, wherein the barrier layer includes at least one of tungsten nitride, tungsten silicon nitride, and titanium silicon nitride, and the barrier layer is operable to prevent a dopant from diffusing through the semiconductor layer and into the insulative layer.

2. The transistor of claim 1, wherein the barrier layer further includes at least one of tungsten silicide and titanium nitride.

3. The transistor of claim 2, wherein the semiconductor layer includes polysilicon.

4. A semiconductor capacitor, comprising:
    a first electrode having a structure having inner and outer surfaces, a rough layer formed on the inner surface, the first electrode including a silicon-germanium alloy and the rough layer including a hemispherical silicon grain layer;
    a dielectric layer formed on the inner and outer surfaces; and
    a second electrode formed on the dielectric layer over the inner and outer surfaces.

5. The semiconductor structure of claim 4, wherein the first electrode comprises a conductive alloy that becomes polycrystalline at a temperature greater than about 500 degrees Celsius.

6. The semiconductor structure of claim 4, wherein the structure comprises a U-shaped structure having inner and outer vertical surfaces.

7. The semiconductor structure of claim 4, wherein the rough layer is formed on both the inner and outer surfaces.

8. The semiconductor structure of claim 7, wherein a portion of the outer surface of the first electrode of the first capacitor is covered by a nonconductive material.

9. A semiconductor memory cell, comprising:
    a semiconductor capacitor having a first electrode having a structure electrically coupled to a first active region in a substrate, the structure having inner and outer surfaces, a rough layer formed on the inner surface, the first electrode including a silicon-germanium alloy and the rough layer including a hemispherical silicon grain layer;
    a dielectric layer formed on the inner and outer surfaces;
    a second electrode formed on the dielectric layer over the inner and outer surfaces; and
    a transistor formed on the substrate and adjacent the first active region, the transistor configured to selectively electrically couple the first active region to a second active region.

10. The semiconductor memory cell of claim 9 wherein the transistor comprises a field-effect transistor having source/drain regions corresponding to the first and second active regions.

11. The semiconductor memory cell of claim 10, wherein the structure of the capacitor comprises a U-shaped structure having inner and outer vertical surfaces.

12. The semiconductor memory cell of claim 10, wherein the rough layer of the capacitor is formed on both the inner and outer surfaces.

13. An integrated device, comprising:
    a first layer capable of accepting a dopant;
    a barrier layer disposed on the first layer and including tungsten nitride, tungsten silicon nitride, or titanium silicon nitride; and
    a second layer disposed on the barrier layer and including the dopant.

14. A transistor, comprising:
    a semiconductor region;
    a source region and a drain region disposed in the semiconductor region;
    a channel region disposed in the semiconductor region between the source and drain regions;
    a gate insulator formed on the channel region;
    a first conductive layer disposed on the gate insulator;
    a conductive barrier layer disposed on the first conductive layer and including tungsten nitride, tungsten silicon nitride, or titanium silicon nitride; and
    a second conductive layer disposed on the barrier layer.

15. The transistor of claim 14 wherein the first conductive layer comprises polysilicon.

16. The transistor of claim 14 wherein the second conductive layer comprises a silicide.

* * * * *